United States Patent
Michigami

(10) Patent No.: US 11,936,359 B2
(45) Date of Patent: Mar. 19, 2024

(54) ACOUSTIC WAVE DEVICE AND MULTIPLEXER

(71) Applicant: Murata Manufacturing Co., Ltd., Nagaokakyo (JP)

(72) Inventor: Akira Michigami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 359 days.

(21) Appl. No.: 17/380,068

(22) Filed: Jul. 20, 2021

(65) Prior Publication Data

US 2022/0224307 A1 Jul. 14, 2022

Related U.S. Application Data

(63) Continuation of application No. PCT/JP2020/002804, filed on Jan. 27, 2020.

(30) Foreign Application Priority Data

Jan. 31, 2019 (JP) .................. 2019-015718

(51) Int. Cl.
| | |
|---|---|
| *H03H 9/02* | (2006.01) |
| *H03H 9/145* | (2006.01) |
| *H03H 9/25* | (2006.01) |
| *H03H 9/64* | (2006.01) |

(52) U.S. Cl.
CPC .... *H03H 9/02228* (2013.01); *H03H 9/02543* (2013.01); *H03H 9/14541* (2013.01); *H03H 9/25* (2013.01); *H03H 9/64* (2013.01)

(58) Field of Classification Search
CPC ............. H03H 9/0228; H03H 9/02543; H03H 9/14541; H03H 9/25; H03H 9/64
See application file for complete search history.

(56) References Cited

U.S. PATENT DOCUMENTS

| | | | |
|---|---|---|---|
| 2003/0174028 A1 | 9/2003 | Takayama et al. | |
| 2004/0174233 A1 | 9/2004 | Takayama et al. | |
| 2009/0265904 A1 | 10/2009 | Kando et al. | |
| 2009/0295508 A1* | 12/2009 | Isobe ................. | H03H 9/0222 333/195 |

(Continued)

FOREIGN PATENT DOCUMENTS

| | | |
|---|---|---|
| JP | 2006-041589 A | 2/2006 |
| JP | 2009-118369 A | 5/2009 |

(Continued)

OTHER PUBLICATIONS

Official Communication issued in International Patent Application No. PCT/JP2020/002804, dated Mar. 24, 2020.

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

An acoustic wave device includes a substrate, an interdigital transducer electrode including electrode fingers on a main surface of the substrate, and a protection film covering the main surface of the substrate, and side surfaces and upper surfaces of the electrode fingers. The protection film includes a portion covering the main surface of the substrate, an intermediate portion between two of the electrode fingers adjacent to each other, and a vicinity portion of the electrode fingers. The intermediate portion is thicker than the vicinity portion.

18 Claims, 6 Drawing Sheets

(56) References Cited

U.S. PATENT DOCUMENTS

| | | | |
|---|---|---|---|
| 2013/0141189 A1 | 6/2013 | Nishimura et al. | |
| 2018/0152169 A1 | 5/2018 | Goto et al. | |
| 2019/0044495 A1 | 2/2019 | Konno | |
| 2020/0067491 A1 | 2/2020 | Ota et al. | |
| 2021/0211115 A1* | 7/2021 | Zuo | H03H 3/04 |

FOREIGN PATENT DOCUMENTS

| | | |
|---|---|---|
| JP | 2011-135468 A | 7/2011 |
| JP | 2013-145930 A | 7/2013 |
| JP | 2018-093487 A | 6/2018 |
| WO | 02/35702 A1 | 5/2002 |
| WO | 03/088483 A1 | 10/2003 |
| WO | 2008/087836 A1 | 7/2008 |
| WO | 2012/120879 A1 | 9/2012 |
| WO | 2018/003657 A1 | 1/2018 |
| WO | 2018/221427 A1 | 12/2018 |

* cited by examiner

ACOUSTIC WAVE DEVICE AND MULTIPLEXER

CROSS REFERENCE TO RELATED APPLICATIONS

This application claims the benefit of priority to Japanese Patent Application No. 2019-015718 filed on Jan. 31, 2019 and is a Continuation Application of PCT Application No. PCT/JP2020/002804 filed on Jan. 27, 2020. The entire contents of each application are hereby incorporated herein by reference.

BACKGROUND OF THE INVENTION

1. Field of the Invention

The present invention relates to an acoustic wave device, and particularly to an acoustic wave device using an SH wave as a main mode and a multiplexer.

2. Description of the Related Art

There has been disclosed a structure including a substrate, a comb-shaped electrode provided on an upper surface of the substrate, and a protection film covering the comb-shaped electrode. In this structure, the thickness of the protection film on an upper surface of an electrode finger of the comb-shaped electrode and the thickness of the protection film on a side surface of the electrode finger are substantially equal to each other (see, Japanese Unexamined Patent Application Publication No. 2006-41589, for example).

Japanese Unexamined Patent Application Publication No. 2006-41589 includes a description of a protection film. In view of moisture resistance provided by a protection film, the thickness thereof is important, that is, it is important to ensure a certain film thickness even at the thinnest portion in order to satisfy a certain moisture resistance level.

In an acoustic wave device using an SH wave as a main mode, a Rayleigh wave response is generated at a frequency that is approximately 0.75 times the frequency of the main mode. For example, in a multiplexer in which two or more filters are connected in common, when the frequency of the Rayleigh wave response of one filter coincides with the pass band of another filter which is connected in common, the bandpass characteristics of the other filter deteriorate.

SUMMARY OF THE INVENTION

Preferred embodiments of the present invention provide acoustic wave devices that are each able to vary the frequency at which the Rayleigh wave response is generated, without substantially changing the frequency characteristics of the main mode.

An acoustic wave device according to a preferred embodiment of the present invention uses an SH wave as a main mode and includes a substrate, an IDT electrode including a plurality of electrode fingers on a main surface of the substrate, and a protection film covering the main surface of the substrate and side surfaces and upper surfaces of the plurality of electrode fingers. The protection film includes a portion covering the main surface of the substrate, an intermediate portion between electrode fingers adjacent to each other, and a vicinity portion of the electrode fingers, the intermediate portion being thicker than the vicinity portion.

Accordingly, by providing the protection film with a non-uniform thickness, it is possible to vary the frequency at which the Rayleigh wave response is generated, as compared to a case in which the protection film has a uniform thickness. Herein, unless the design parameters of the IDT electrode are changed, the frequency characteristics of the main mode do not substantially change. Thus, it is possible to obtain acoustic wave devices that are each able to vary the frequency at which the Rayleigh wave response is generated, without substantially changing the frequency characteristics of the main mode.

For example, when the Rayleigh wave response adversely affects the bandpass characteristics of other filters, providing the protection film with a non-uniform thickness may shift the frequency of the Rayleigh wave response from the pass band of other filters while maintaining the frequency characteristics of the main mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail with reference to examples and drawings. It should be noted that the preferred embodiments described below are all inclusive or specific examples. The numerical values, shapes, materials, elements, the arrangement and connection of the elements, and the like described in the following preferred embodiments are merely examples, and are not intended to limit the present invention.

Before describing an acoustic wave device according to a preferred embodiment of the present invention, a general structure of an acoustic wave device will be described with reference to an example of a surface acoustic wave (SAW) resonator.

Figure 1:
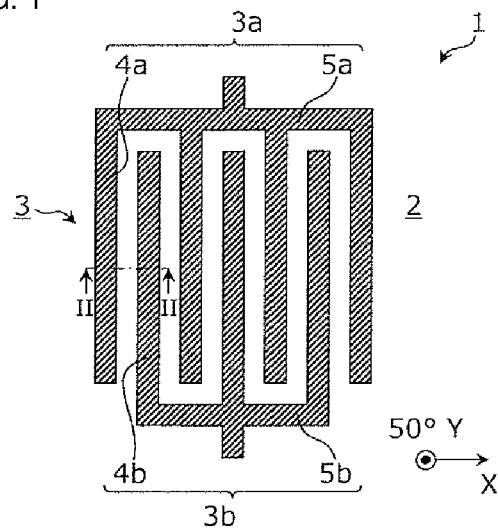
FIG. 1 is a plan view schematically illustrating an example of a general structure of a SAW resonator.

FIG. 1 is a plan view schematically illustrating an example of a general structure of a SAW resonator (hereinafter also simply referred to as a resonator). As illustrated in FIG. 1, a resonator 1 includes a substrate 2 and a pair of comb-shaped electrodes 3a and 3b on the substrate 2. The pair of comb-shaped electrodes 3a and 3b define an IDT electrode 3.

The comb-shaped electrode 3a includes electrode fingers 4a in a comb-shape and parallel or substantially parallel to each other, and a busbar electrode 5a connecting ends of the electrode fingers 4a to each other. Further, the comb-shaped electrode 3b includes electrode fingers 4b in a comb-shape and parallel or substantially parallel to each other, and a busbar electrode 5b connecting ends of the electrode fingers 4b to each other. The electrode fingers 4a and 4b extend in a direction orthogonal or substantially orthogonal to the acoustic wave propagation direction X.

Note that the resonator 1 is illustrated in FIG. 1 for describing a general structure of a SAW resonator, and the numbers, lengths and the like, for example, of the electrode fingers 4a and 4b of the comb-shaped electrodes 3a and 3b are not limited to those illustrated in FIG. 1.

Figure 2:
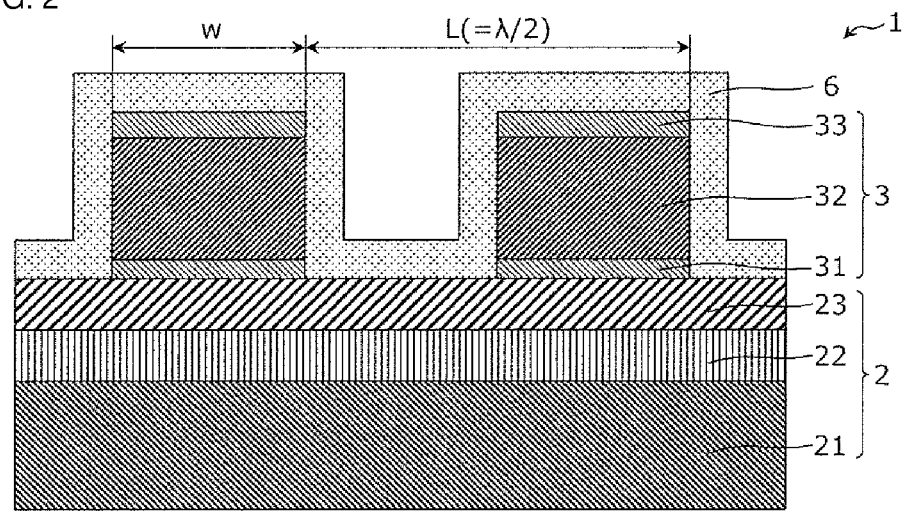
FIG. 2 is a sectional view schematically illustrating an example of a general structure of a SAW resonator.

FIG. 2 is a sectional view schematically illustrating an example of a general structure of the SAW resonator and corresponds to a section taken along line II-II of FIG. 1. As illustrated in FIG. 2, the substrate 2 is a multilayer body including a piezoelectric layer 23, a low acoustic velocity film 22, and a high acoustic velocity support substrate 21. The IDT electrode 3 (that is, electrode fingers 4a and 4b and busbar electrodes 5a and 5b) includes multilayer body including an adhesion layer 31, a main electrode layer 32, and an adhesion layer 33.

The substrate 2 is a multilayer body in which the high acoustic velocity support substrate 21, the low acoustic velocity film 22, and the piezoelectric layer 23 are laminated in this order.

The high acoustic velocity support substrate 21 supports the low acoustic velocity film 22, the piezoelectric layer 23, the IDT electrode 3, and a protection film 6. The high acoustic velocity support substrate 21 is a substrate in which the acoustic velocity of a bulk wave in the high acoustic velocity support substrate 21 is higher than the acoustic velocity of an acoustic wave (surface wave) propagating through the piezoelectric layer 23, and the high acoustic velocity support substrate 21 is made of Si (silicon), for example. The thickness of the high acoustic velocity support substrate 21 is not particularly limited.

The low acoustic velocity film 22 is a film in which the acoustic velocity of a bulk wave in the low acoustic velocity film is lower than the acoustic velocity of an acoustic wave propagating through the piezoelectric layer 23, and the low acoustic velocity film 22 is made of a material containing $SiO_2$ (silicon dioxide) as a main component, for example. The thickness of the low acoustic velocity film 22 is about 673 nm, for example.

The piezoelectric layer 23 is a layer through which a surface acoustic wave excited by the IDT electrode 3 propagates, and is made of a 50° Y cut X propagation $LiTaO_3$ piezoelectric single crystal or piezoelectric ceramics (lithium tantalate single crystal cut along a plane whose normal line is rotated from a Y axis by about 50° with an X axis as a central axis or ceramics), for example. The thickness of the piezoelectric layer 23 is about 600 nm, for example.

By using the substrate 2 with the layered structure described above, the efficiency of confining the acoustic wave energy in the thickness direction of the substrate 2 is increased. This may increase the Q factor at the resonant frequency and the anti-resonant frequency. Note that, it is not necessary for the substrate 2 to have a layered structure, and the substrate 2 may be a piezoelectric substrate including a single layer.

The IDT electrode 3 is provided on the substrate 2 and includes a multilayer body including the adhesion layer 31, the main electrode layer 32, and the adhesion layer 33. The layered structure of the IDT electrode 3 illustrated in FIG. 2 is applied to the electrode fingers 4a and 4b and the busbar electrodes 5a and 5b.

The adhesion layer 31 improves adhesion between the piezoelectric layer 23 and the main electrode layer 32, and is made of Ti (titanium), for example. The thickness of the adhesion layer 31 is about 6 nm, for example.

The main electrode layer 32 is made of Al (aluminum) or an Al alloy, for example. The thickness of the main electrode layer 32 is about 130 nm, for example.

The adhesion layer 33 improves adhesion between the main electrode layer 32 and the protection film 6, and is made of Ti (titanium), for example. The thickness of the adhesion layer 33 is about 12 nm, for example.

The IDT electrode 3 (in particular, electrode fingers 4a and 4b) has a line width w of about 0.5 µm and a disposition interval L of about 1 µm, for example. The disposition interval L corresponds to half of a wavelength λ of about 2.0 µm of the surface acoustic wave propagating through the piezoelectric layer 23.

The protection film 6 improves the durability of the IDT electrode 3, and is made of a material including $SiO_2$ (silicon dioxide) as a main component, for example. The protection film 6 continuously covers the main surface of the substrate 2 on which the IDT electrode 3 is provided, and the side surface and the upper surface of the IDT electrode 3.

The resonator 1 is an example of an acoustic wave device using an SH wave as a main mode, and a Rayleigh wave response is generated at a frequency approximately 0.75 times the frequency of the main mode.

The resonator 1 may be used for two or more filters connected in common to define a multiplexer, for example. In this case, when the frequency of the Rayleigh wave response of one filter coincides with the pass band of another filter which is connected in common, the bandpass characteristics of the other filter deteriorate. Thus, it is necessary to shift the frequency of the Rayleigh wave response from the pass band of the other filter which is connected in common.

For example, it is possible to shift the frequency of the Rayleigh wave response by changing the design parameters (for example, line width w and disposition interval L described above, and the like) of the IDT electrode 3. However, changing the design parameters is not effective as a practical measure since the frequency characteristics of the main mode also change.

Thus, the inventor of preferred embodiments of the present invention studied a design parameter on which the Rayleigh wave of the SH wave and the Rayleigh wave depends, and have invented structures in each of which the protection film with a non-uniform thickness is provided. Hereinafter, the film thickness of the protection film in the resonator according to a preferred embodiment of the present invention will be described in detail. In the following description, the electrode fingers 4a and 4b are collectively referred to as an electrode finger 4 or electrode fingers 4.

Preferred Embodiment

Figure 3:
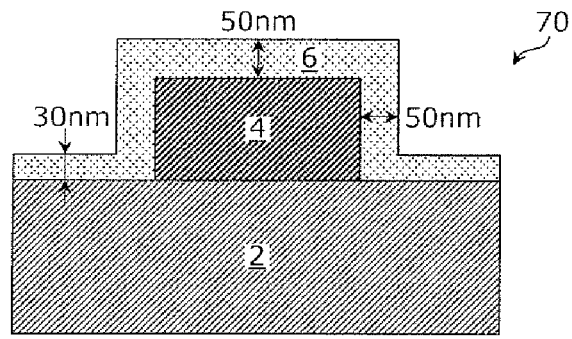
FIG. 3 is a sectional view illustrating a protection film according to Comparative Example 1.

FIG. 3 is a sectional view illustrating the shape of the protection film 6 according to Comparative Example 1. In FIG. 3, a region is illustrated, with one electrode finger 4 of the IDT electrode 3 being in the center, from the electrode finger 4 to intermediate points between the electrode finger 4 and electrode fingers (not shown) adjacent to the electrode finger 4 on both sides. The resonator including the protection film 6 with the shape in FIG. 3 is referred to as a resonator 70.

In the resonator 70, the protection film 6 includes a first portion covering the main surface of the substrate 2 and having the uniform thickness of about 30 nm, the protection film includes a second portion covering the upper surface of the electrode finger 4 and having the uniform thickness of about 50 nm, and the protection film 6 includes a third portion covering the side surface of the electrode finger 4 and having the uniform thickness of about 50 nm. The sectional structure illustrated in FIG. 3 is provided, in the resonator 70, with each electrode finger 4 being in the center.

Figure 4A:
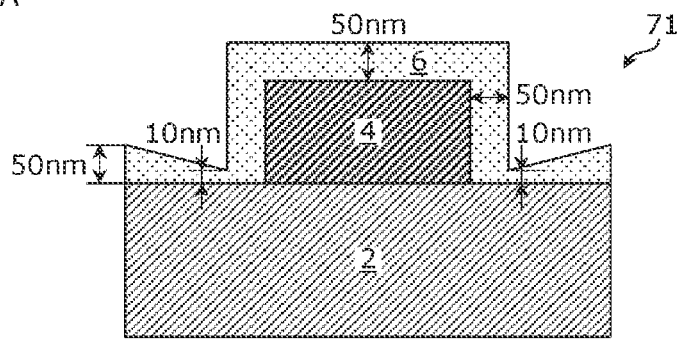
FIGS. 4A and 4B are sectional views illustrating a shape of a protection film according to Example 1 of a preferred embodiment of the present invention.
Figure 4B:
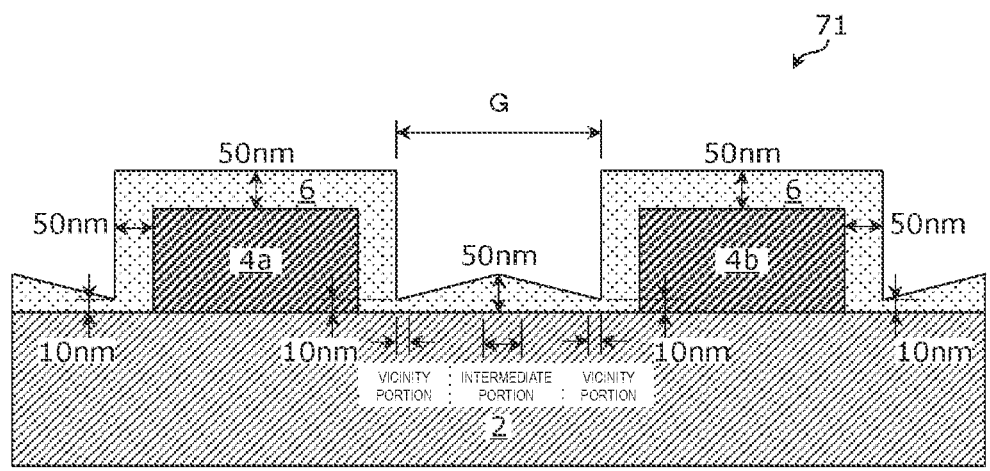

FIGS. 4A and 4B are sectional views illustrating the shape of the protection film 6 according to Example 1 of the present preferred embodiment. In FIG. 4A, a region is illustrated, with one electrode finger 4 of the IDT electrode 3 being in the center, from the electrode finger 4 to intermediate points between the electrode finger 4 and electrode fingers (not shown) adjacent to the electrode finger 4 on both sides. In FIG. 4B, two adjacent electrode fingers 4a and 4b are illustrated. Note that "adjacent electrode fingers" refer to the electrode finger 4a and the electrode finger 4b that are disposed adjacent to each other, and do not refer to the electrode fingers 4a adjacent to each other of the plurality of electrode fingers 4a or the electrode fingers 4b adjacent to each other of the plurality of electrode fingers 4b. The resonator including the protection film 6 with the shape in FIGS. 4A and 4B is referred to as a resonator 71.

In the resonator 71, the first portion of the protection film 6 covering the main surface of the substrate 2 includes an intermediate portion between the electrode fingers 4 adjacent to each other, the intermediate portion having the thickness of about 50 nm, and a vicinity portion of the electrode fingers 4, the vicinity portion having the thickness of about 10 nm, for example. Further, the second portion of the protection film 6 covering the upper surface of the electrode finger 4 has the uniform thickness of about 50 nm, for example, and the third portion of the protection film 6 covering the side surface of the electrode finger 4 has the uniform thickness of about 50 nm, for example. That is, in the resonator 71, in the first portion of the protection film 6 covering the main surface of the substrate 2, the intermediate portion between the electrode fingers 4 adjacent to each other is thicker than the vicinity portion of the electrode fingers 4. For example, when the interval (gap) between two protection films 6 covering the side surfaces of the electrode fingers 4a and 4b and facing each other is defined as G, the intermediate portion between the electrode fingers adjacent to each other includes the intermediate point between the two protection films 6 above, and is in the range of about 0 G or more and about 0.1 G or less apart from the intermediate point being the reference to each of a side of the electrode finger 4a and a side of the electrode finger 4b. Further, the vicinity portion of the electrode finger is in the range of about 0 G or more and about 0.1 G or less apart from the protection film 6 covering the side surface of the electrode finger 4a, or the range of about 0 G or more and about 0.1 G or less apart from the protection film 6 covering the side surface of the electrode finger 4b. The sectional structure illustrated in FIGS. 4A and 4B is provided in the resonator 71, with each electrode finger 4 being in the center.

Models of the resonators 70 and 71 were provided in accordance with the dimensional conditions illustrated in FIG. 3 and FIGS. 4A and 4B, and frequency characteristics of impedance were obtained by simulation. The design parameters of the IDT electrode 3 were the same or substantially the same in the resonators 70 and 71.

Figure 5:
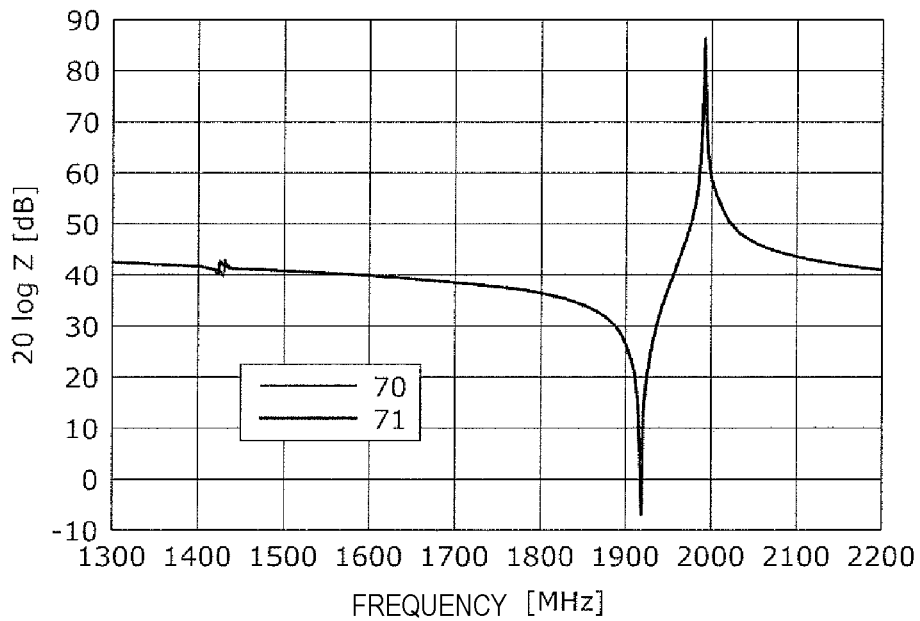
FIG. 5 is a graph showing frequency characteristics of SAW resonators according to Comparative Example 1 and Example 1.

FIG. 5 is a graph showing examples of frequency characteristics of impedance of the resonators 70 and 71. As can be seen in FIG. 5, the responses in the main mode generated in the vicinity of about 1900 MHz to about 2000 MHz are the same or substantially the same in the resonators 70 and 71. That is, whether the protection film 6 is uniform or non-uniform does not substantially affect the frequency characteristics of the main mode. By contrast, frequencies of the Rayleigh wave responses generated in the vicinity of about 1420 MHz to about 1440 MHz are different from each other in the resonators 70 and 71.

Figure 6:
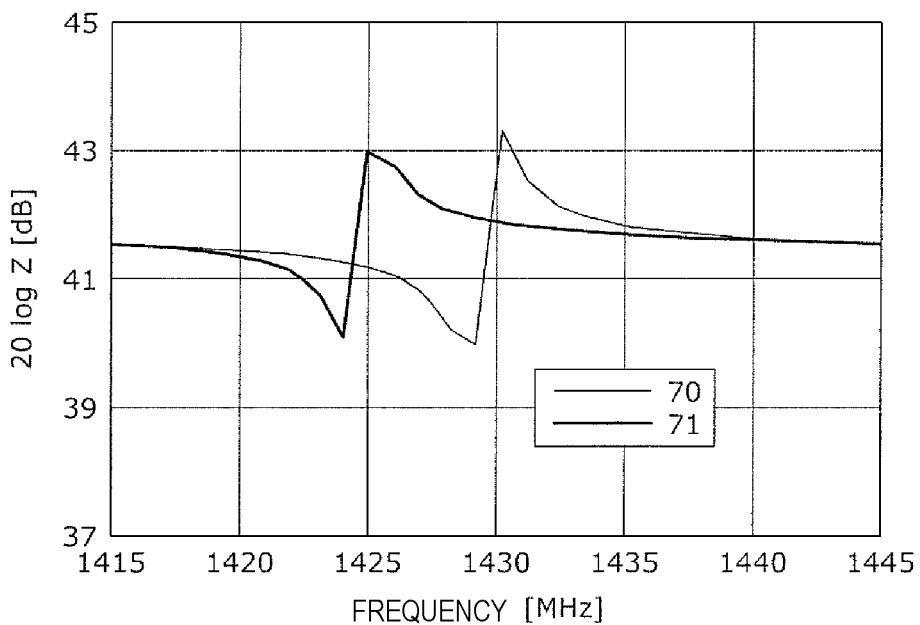
FIG. 6 is a graph showing frequency characteristics of SAW resonators according to Comparative Example 1 and Example 1.

FIG. 6 is a graph showing the enlarged Rayleigh wave response. As can be seen in FIG. 6, the frequencies of the Rayleigh wave responses differ by approximately 5 MHz in the resonators 70 and 71.

From this result, it is understood that the frequency at which the Rayleigh wave response is generated may be varied by providing the protection film with a non-uniform thickness without substantially changing the frequency characteristics of the main mode, as compared with the case of providing the protection film with a uniform thickness.

Hereinafter, resonators according to other preferred embodiments of the present invention in which the shape of the protection film 6 is different will be described.

Figure 7:
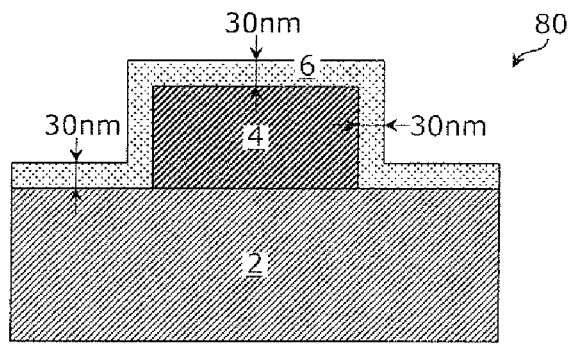
FIG. 7 is a sectional view illustrating a shape of a protection film according to Comparative Example 2.

FIG. 7 is a sectional view illustrating the shape of the protection film 6 according to Comparative Example 2. In FIG. 7, a region I illustrated, with one electrode finger 4 of the IDT electrode 3 being in the center, from the electrode finger 4 to intermediate points between the electrode finger 4 and electrode fingers (not shown) adjacent to the electrode finger 4 on both sides. The resonator including the protection film 6 with the shape in FIG. 7 is referred to as a resonator 80.

In the resonator 80, the first portion of the protection film 6 covering the main surface of the substrate 2 has a uniform thickness of about 30 nm, the second portion of the protection film 6 covering the upper surface of the electrode finger 4 has a uniform thickness of about 30 nm, and the third portion of the protection film 6 covering the side surface of the electrode finger 4 has a uniform thickness of about 30 nm. The sectional structure illustrated in FIG. 7 is provided, in the resonator 80, with each electrode finger 4 being in the center.

Figure 8:
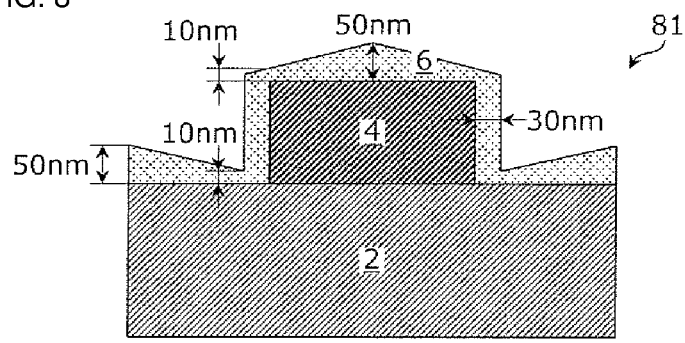
FIG. 8 is a sectional view illustrating a shape of a protection film according to Example 2 of a preferred embodiment of the present invention.

FIG. 8 is a sectional view illustrating the shape of the protection film 6 according to Example 2 of a preferred embodiment of the present invention. In FIG. 8, a region is illustrated, with one electrode finger 4 of the IDT electrode 3 being in the center, from the electrode finger 4 to intermediate points between the electrode finger 4 and electrode fingers (not shown) adjacent to the electrode finger 4 on both sides. The resonator including the protection film 6 with the shape in FIG. 8 is referred to as a resonator 81.

In the resonator 81, the first portion of the protection film 6 covering the main surface of the substrate 2 includes the intermediate portion between the electrode fingers 4 adjacent to each other, the intermediate portion having the thickness of about 50 nm, for example, and the vicinity portion of the electrode finger 4, the vicinity portion having the thickness of about 10 nm, for example. Further, the second portion of the protection film 6 covering the upper surface of the electrode finger 4 includes a portion covering a central portion of the upper surface and having the thickness of about 50 nm and a portion covering an end portion of the upper surface and having the thickness of about 10 nm, for example. Further, the third portion of the protection film 6 covering the side surface of the electrode finger 4 has a uniform thickness of about 30 nm, for example. That is, in the resonator 81, the following relationships are provided. In the first portion of the protection film 6 covering the main surface of the substrate 2, the intermediate portion between the electrode fingers 4 adjacent to each other is thicker than the vicinity portion of the electrode fingers 4. In addition, in the second portion of the protection film 6 covering the upper surface of the electrode finger 4, the portion covering the central portion of the upper surface is thicker than the portion covering the end portion of the upper surface. The sectional structure illustrated in FIG. 8 is provided, in the resonator 81, with each electrode finger 4 being in the center.

Figure 9:
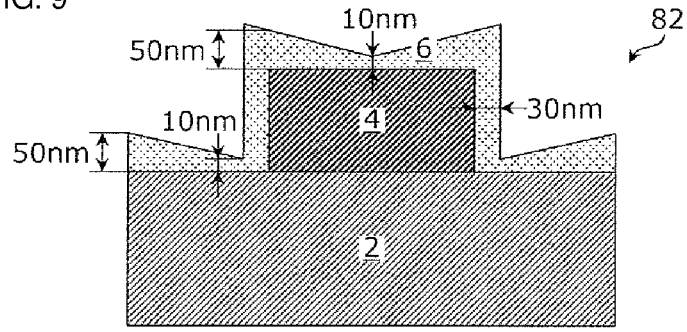
FIG. 9 is a sectional view illustrating a shape of a protection film according to Example 3 of a preferred embodiment of the present invention.

FIG. 9 is a sectional view illustrating the shape of the protection film 6 according to Example 3 of a preferred embodiment of the present invention. In FIG. 9, a region is illustrated, with one electrode finger 4 of the IDT electrode 3 being in the center, from the electrode finger 4 to intermediate points between the electrode finger 4 and electrode fingers (not shown) adjacent to the electrode finger 4 on both sides. The resonator including the protection film 6 with the shape in FIG. 9 is referred to as a resonator 82.

In the resonator 82, the first portion of the protection film 6 covering the main surface of the substrate 2 includes the intermediate portion between the electrode fingers 4 adjacent to each other, the intermediate portion having the thickness of about 50 nm, for example, and the vicinity portion of the electrode finger 4, the vicinity portion having the thickness of about 10 nm, for example. Further, the second portion of the protection film 6 covering the upper surface of the electrode finger 4 includes the portion covering the central portion of the upper surface and having the thickness of about 10 nm, for example, and the portion covering the end portion of the upper surface and having the thickness of about 50 nm, for example. Further, the third portion of the protection film 6 covering the side surface of the electrode finger 4 has the uniform thickness of about 30 nm, for example. That is, in the resonator 82, the following relationships are provided. In the first portion of the protection film 6 covering the main surface of the substrate 2, the intermediate portion between the electrode fingers 4 adjacent to each other is thicker than the vicinity portion of the electrode fingers 4. In addition, in the second portion of the protection film 6 covering the upper surface of the electrode finger 4, the portion covering the central portion of the upper surface is thinner than the portion covering the end portion of the upper surface. The sectional structure illustrated in FIG. 9 is provided in the resonator 82, with each electrode finger 4 being in the center.

Figure 10:
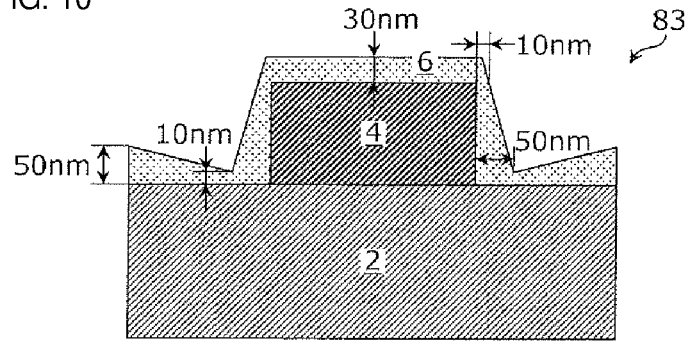
FIG. 10 is a sectional view illustrating a shape of a protection film according to Example 4 of a preferred embodiment of the present invention.

FIG. 10 is a sectional view illustrating the shape of the protection film 6 according to Example 4 of a preferred embodiment of the present invention. In FIG. 10, a region is illustrated, with one electrode finger 4 of the IDT electrode 3 being in the center, from the electrode finger 4 to intermediate points between the electrode finger 4 and electrode fingers (not shown) adjacent to the electrode finger 4 on both sides. The resonator including the protection film 6 with the shape in FIG. 10 is referred to as a resonator 83.

In the resonator 83, the first portion of the protection film 6 covering the main surface of the substrate 2 includes the intermediate portion between the electrode fingers 4 adjacent to each other, the intermediate portion having the thickness of about 50 nm, for example, and the vicinity portion of the electrode finger 4, the vicinity portion having the thickness of about 10 nm, for example. Further, the second portion of the protection film 6 covering the upper surface of the electrode finger 4 has a uniform thickness of about 30 nm, for example. Further, the third portion of the protection film 6 covering the side surface of the electrode finger 4 includes a portion covering a lower portion of the side surface and having the thickness of about 50 nm, and a portion covering an upper portion of the side surface and having the thickness of about 10 nm, for example. That is, in the resonator 83, the following relationships are provided. In the first portion of the protection film 6 covering the main surface of the substrate 2, the intermediate portion between the electrode fingers 4 adjacent to each other is thicker than the vicinity portion of the electrode fingers 4. In addition, in the third portion of the protection film 6 covering the side surface of the electrode finger 4, the portion covering the lower portion of the side surface is thicker than the portion covering the upper portion of the side surface. The sectional structure illustrated in FIG. 10 is provided in the resonator 83, with each electrode finger 4 being in the center.

Figure 11:
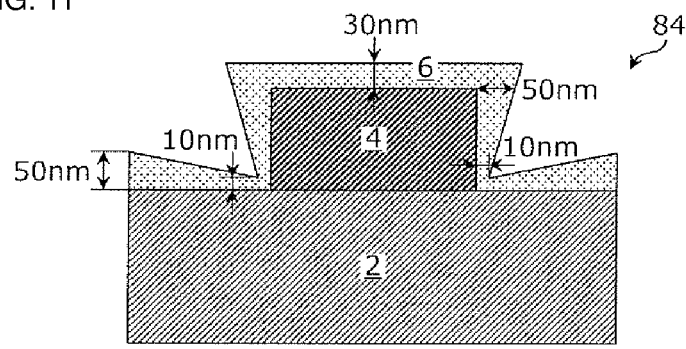
FIG. 11 is a sectional view illustrating a shape of a protection film according to Example 5 of a preferred embodiment of the present invention.

FIG. 11 is a sectional view illustrating the shape of the protection film 6 according to Example 5 of a preferred embodiment of the present invention. In FIG. 11, a region is illustrated, with one electrode finger 4 of the IDT electrode 3 being in the center, from the electrode finger 4 to intermediate points between the electrode finger 4 and electrode fingers (not shown) adjacent to the electrode finger 4 on both sides. The resonator including the protection film 6 with the shape in FIG. 11 is referred to as a resonator 84.

In the resonator 84, the first portion of the protection film 6 covering the main surface of the substrate 2 includes the intermediate portion between the electrode fingers 4 adjacent to each other, the intermediate portion having the thickness of about 50 nm, for example, and the vicinity portion of the electrode fingers 4, the vicinity portion having the thickness of about 10 nm, for example. Further, the second portion of the protection film 6 covering the upper surface of the electrode finger 4 has a uniform thickness of about 30 nm, for example. Further, the third portion of the protection film 6 covering the side surface of the electrode finger 4 includes the portion covering the lower portion of the side surface and having the thickness of about 10 nm, and the portion covering the upper portion of the side surface and having the thickness of about 50 nm, for example. That is, in the resonator 84, the following relationships are provided. In the first portion of the protection film 6 covering the main surface of the substrate 2, the intermediate portion between the electrode fingers 4 adjacent to each other is thicker than the vicinity portion of the electrode fingers 4. In addition, in the third portion of the protection film 6 covering the side surface of the electrode finger 4, the portion covering the lower portion of the side surface is thinner than the portion covering the upper portion of the side surface. The sectional structure illustrated in FIG. 11 is provided in the resonator 84, with each electrode finger 4 being in the center.

Figure 12:
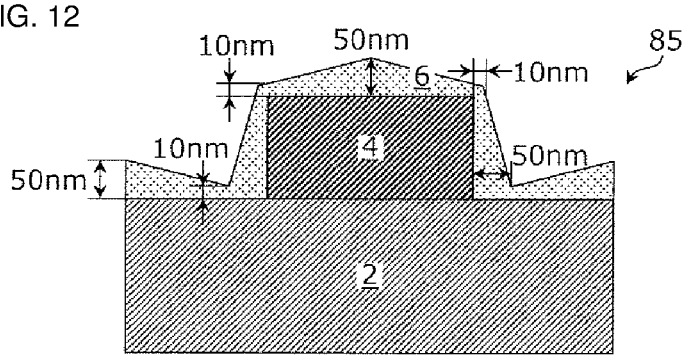
FIG. 12 is a sectional view illustrating a shape of a protection film according to Example 6 of a preferred embodiment of the present invention.

FIG. 12 is a sectional view illustrating the shape of the protection film 6 according to Example 6 of a preferred embodiment of the present invention. In FIG. 12, a region is illustrated, with one electrode finger 4 of the IDT electrode 3 being in the center, from the electrode finger 4 to intermediate points between the electrode finger 4 and electrode fingers (not shown) adjacent to the electrode finger 4 on both sides. The resonator including the protection film 6 with the shape in FIG. 12 is referred to as a resonator 85.

In the resonator 85, the first portion of the protection film 6 covering the main surface of the substrate 2 includes the intermediate portion between the electrode fingers 4 adjacent to each other, the intermediate portion having the thickness of about 50 nm, for example, and the vicinity portion of the electrode finger 4, the vicinity portion having the thickness of about 10 nm, for example. Further, the second portion of the protection film 6 covering the upper surface of the electrode finger 4 includes the portion covering the central portion of the upper surface and having the thickness of about 50 nm, and the portion covering the end portion of the upper surface and having the thickness of about 10 nm, for example. Further, the third portion of the protection film 6 covering the side surface of the electrode finger 4 includes the portion covering the lower portion of the side surface and having the thickness of about 50 nm, and the portion covering the upper portion of the side surface and having the thickness of about 10 nm, for example. That is, in the resonator 85, the following relationships are provided. In the first portion of the protection film 6 covering the main surface of the substrate 2, the intermediate portion between the electrode fingers 4 adjacent to each other is thicker than the vicinity portion of the electrode fingers 4. In addition, in the second portion of the protection film 6 covering the upper surface of the electrode finger 4, the portion covering the central portion of the upper surface is thicker than the portion covering the end portion of the upper surface. Further, in the third portion of the protection film 6 covering the side surface of the electrode finger 4, the portion covering the lower portion of the side surface is thicker than the portion covering the upper portion of the side surface. The sectional structure illustrated in FIG. 12 is provided in the resonator 85, with each electrode finger 4 being in the center.

Models of the resonators 80 to 85 were provided in accordance with the dimensional conditions illustrated in FIG. 7 to FIG. 12, and frequency characteristics of impedance were obtained by simulation. The design parameters of the IDT electrode 3 were the same or substantially the same in the resonators 80 to 85. The responses in the main mode were substantially the same in the resonators 80 to 85 (not illustrated).

Figure 13:
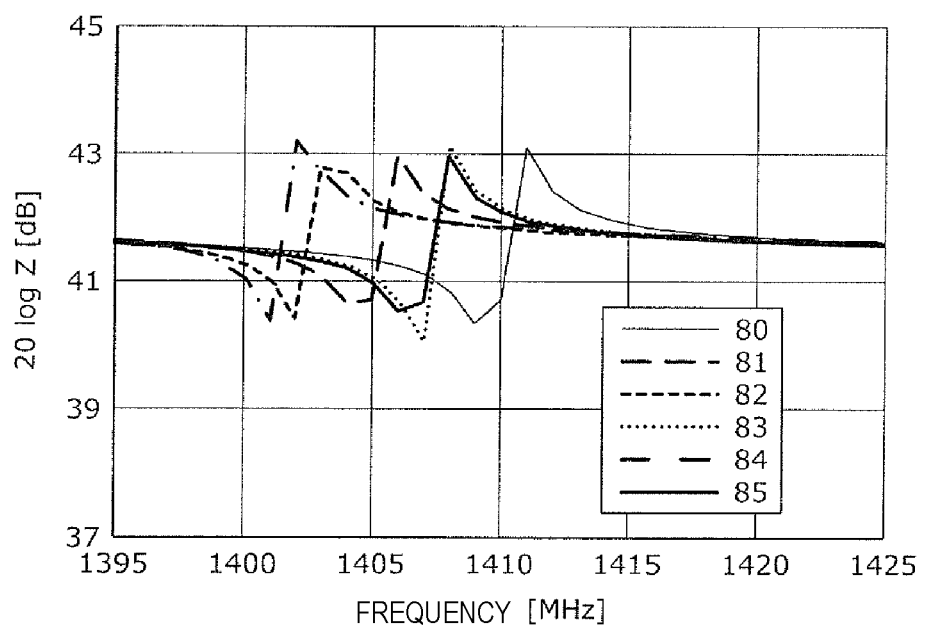
FIG. 13 is a graph showing frequency characteristics of the SAW resonators according to comparative Example 2 and Examples 2 to 6.

FIG. 13 is a graph showing the enlarged Rayleigh wave responses of the resonators 80 to 85. As can be seen in FIG. 13, in the frequencies of the Rayleigh wave responses, there is a difference of approximately 3 MHz to approximately 9 MHz between the resonator 80 and each of the resonators 81 to 85.

From this result, it is understood that the frequency at which the Rayleigh wave response is generated may be varied by providing the protection film with a non-uniform thickness without substantially changing the frequency characteristics of the main mode, as compared with the case of providing the protection film with a uniform thickness.

The above-described resonator provided with the protection film with a non-uniform thickness may be used in two or more filters connected in common to define a multiplexer, for example.

Figure 14:
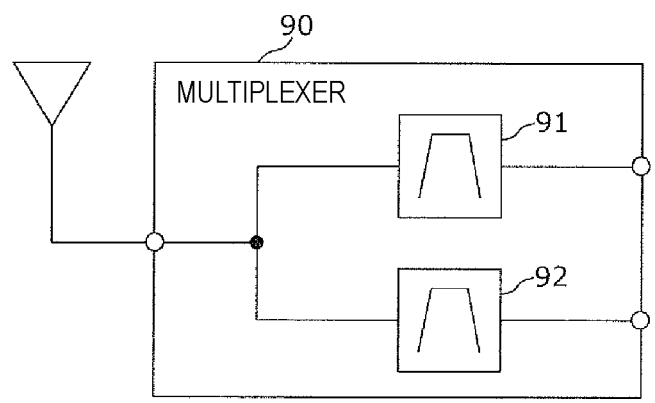
FIG. 14 is a functional block diagram illustrating an example of a general configuration of a multiplexer.

FIG. 14 is a functional block diagram illustrating an example of a general configuration of a multiplexer. As illustrated in FIG. 14, a multiplexer 90 includes filters 91 and 92 with one ends of which are connected in common to each other, and at least one of the filters 91 and 92 includes an acoustic wave device (any one of resonators 71, and 81 to 85, for example) including the protection film with a non-uniform thickness.

In the multiplexer 90, it is assumed that the frequency of the Rayleigh wave response of the filter 91 coincides with the pass band of the filter 92, for example. In this case, configuring the filter 91 with a resonator including the protection film with a non-uniform thickness may shift the frequency of the Rayleigh wave response of the filter 91 from the pass band of the filter 92 while maintaining the bandpass characteristics of the filter 91.

The acoustic wave devices and multiplexers according to preferred embodiments of the present invention have been described with reference to examples of preferred embodiments, but the present invention is not limited to the individual preferred embodiments described above. A preferred embodiment to which various modifications conceived by those skilled in the art are applied and a preferred embodiment provided by combining elements in different preferred embodiments are included in the scope of the present invention.

A non-limiting example of a method of forming a protection film with a non-uniform thickness is not particularly limited. Examples of forming the protection film with a non-uniform thickness include adjusting a sputtering condition at the time of forming the protection film, and adjusting etching or milling conditions in the process of adjusting the frequency by reducing the protection film. That is, the protection film of non-uniform thickness may be formed at low cost by using existing processes.

Specifically, a process of forming the protection film into a specific shape may be controlled at the time of frequency adjustment (at the time of reducing the protection film). That is, the process may be performed simultaneously with the frequency adjustment of the main mode after the confirmation of the waveform before the frequency adjustment.

Further, it is also possible to use an adaptive method as follows. The positions of the main mode and the Rayleigh wave response are determined before the formation of the protection film or before the frequency adjustment, and the conditions of sputtering, etching, and milling are changed for each sample as necessary.

As described above, an acoustic wave device according to a preferred embodiment uses an SH wave as a main mode, and includes a substrate, an IDT electrode including a plurality of electrode fingers provided on a main surface of the substrate, and a protection film continuously covering the main surface of the substrate and side surfaces and upper surfaces of the plurality of electrode fingers. The protection film includes a portion covering the main surface of the substrate, an intermediate portion between electrode fingers adjacent to each other, and a vicinity portion of the electrode fingers. The intermediate portion is thicker than the vicinity portion.

Further, the protection film includes a portion covering the upper surface of the electrode finger and including a portion covering a central portion of the upper surface and a portion covering an end portion of the upper surface. The portion covering the central portion may be thicker than the portion covering the end portion.

Further, the protection film includes a portion covering the upper surface of the electrode finger and including a portion covering a central portion of the upper surface and a portion covering an end portion of the upper surface. The portion covering the central portion may be thinner than the portion covering the end portion.

Further, the protection film includes a portion covering the side surface of the electrode finger and including a portion covering a lower portion of the side surface and a portion covering an upper portion of the side surface. The portion covering the lower portion may be thicker than the portion covering the upper portion.

Further, the protection film includes a portion covering the side surface of the electrode finger and including a portion covering a lower portion of the side surface and a portion covering an upper portion of the side surface. The portion covering the lower portion may be thinner than the portion covering the upper portion.

By providing the protection film with a non-uniform thickness, it is possible to vary the frequency at which the Rayleigh wave response is generated, as compared with the case of the protection film with a uniform thickness. At this time, when the design parameters of the IDT electrode are not changed, the frequency characteristics of the main mode do not substantially change. Thus, it is possible to obtain an acoustic wave device capable of varying the frequency at which the Rayleigh wave response is generated, without substantially changing the frequency characteristics of the main mode.

For example, when the Rayleigh wave response adversely affects the bandpass characteristics of another filter, providing the protection film with a non-uniform thickness may shift the frequency of the Rayleigh wave response from the pass band of the other filter while maintaining the frequency characteristics of the main mode.

Further, the substrate may include a piezoelectric layer which is made of a piezoelectric material including lithium tantalate and on one main surface of which the IDT electrode is provided.

Further, the substrate may include a piezoelectric layer which is made of a piezoelectric material including lithium tantalate and on one main surface of which the IDT electrode is provided, a high acoustic velocity support substrate in which an acoustic velocity of a bulk wave propagating through is higher than an acoustic velocity of an acoustic wave propagating through the piezoelectric layer, and a low acoustic velocity film which is disposed between the high acoustic velocity support substrate and the piezoelectric layer and in which an acoustic velocity of a bulk wave propagating through is lower than an acoustic velocity of an acoustic wave propagating through the piezoelectric layer.

With this configuration, it is possible to obtain an acoustic wave device capable of varying the frequency at which the Rayleigh wave response is generated, without substantially changing the frequency characteristics of the main mode, regardless of whether the acoustic wave device is a substrate including a single layer structure or a multilayer structure.

Further, the maximum thickness of the protection film may be equal to or less than about half the thickness of the IDT electrode.

With this, the protection film does not become excessively thick, and the deterioration of the Q factor which is caused when a protection film is thick may be reduced or prevented. As a result, an acoustic wave device with excellent characteristics may be obtained.

A multiplexer according to a preferred embodiment of the present invention includes two or more filters one ends of which are connected to each other, and at least one of the two or more filters includes the acoustic wave device.

With this configuration, a multiplexer having excellent bandpass characteristics may be obtained based on the advantageous effects of the acoustic wave device described above.

Preferred embodiments of the present invention may be widely used as acoustic wave devices and multiplexers including the acoustic wave devices in communication devices, such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a substrate;
   an interdigital transducer (IDT) electrode including a plurality of electrode fingers on a main surface of the substrate; and
   a protection film covering the main surface of the substrate, and side surfaces and upper surfaces of the plurality of electrode fingers; wherein
   the protection film includes a portion covering the main surface of the substrate, an intermediate portion between two electrode fingers of the plurality of electrode fingers adjacent to each other, and a vicinity portion of the electrode fingers in a vicinity of the two electrode fingers, the intermediate portion being thicker than the vicinity portion; and
   a maximum thickness of the protection film is equal to or less than about half of a thickness of the IDT electrode.

2. The acoustic wave device according to claim 1, wherein the protection film includes a portion covering a central portion of the upper surface of at least one of the two electrode fingers and a portion covering an end portion of the upper surface of the at least one of the two electrode fingers, the portion covering the central portion being thicker than the portion covering the end portion.

3. The acoustic wave device according to claim 1, wherein the protection film includes a portion covering a central portion of the upper surface of at least one of the two electrode fingers and a portion covering an end portion of the upper surface of the at least one of the two electrode fingers, the portion covering the central portion being thinner than the portion covering the end portion.

4. The acoustic wave device according to claim 1, wherein the substrate includes a piezoelectric layer made of a piezoelectric material including lithium tantalate and on one main surface of which the IDT electrode is provided.

5. The acoustic wave device according to claim 1, wherein the substrate includes:
   a piezoelectric layer made of a piezoelectric material including lithium tantalate and on one main surface of which the IDT electrode is provided;
   a high acoustic velocity support substrate in which an acoustic velocity of a bulk wave propagating through is higher than an acoustic velocity of an acoustic wave propagating through the piezoelectric layer; and
   a low acoustic velocity film which is between the high acoustic velocity support substrate and the piezoelectric layer and in which an acoustic velocity of a bulk wave propagating through is lower than an acoustic velocity of an acoustic wave propagating through the piezoelectric layer.

6. A multiplexer comprising:
two or more filters each including ends connected to each other; wherein
at least one of the two or more filters includes the acoustic wave device according to claim 1.

7. The acoustic wave device according to claim 2, wherein the protection film includes a portion covering a lower portion of the side surface of at least one of two electrode fingers and a portion covering an upper portion of the side surface of the at least one of the two electrode fingers, the portion covering the lower portion being thicker than the portion covering the upper portion.

8. The acoustic wave device according to claim 2, wherein the protection film includes a portion covering a lower portion of the side surface of at least one of the two electrode fingers and a portion covering an upper portion of the side surface of the at least one of the two electrode fingers, the portion covering the lower portion being thinner than the portion covering the upper portion.

9. The acoustic wave device according to claim 3, wherein the protection film includes a portion covering a lower portion of the side surface of at least one of two electrode fingers and a portion covering an upper portion of the side surface of the at least one of the two electrode fingers, the portion covering the lower portion being thicker than the portion covering the upper portion.

10. The acoustic wave device according to claim 3, wherein the protection film includes a portion covering a lower portion of the side surface of at least one of the two electrode fingers and a portion covering an upper portion of the side surface of the at least one of the two electrode fingers, the portion covering the lower portion being thinner than the portion covering the upper portion.

11. The acoustic wave device according to claim 2, wherein the substrate includes a piezoelectric layer made of a piezoelectric material including lithium tantalate and on one main surface of which the IDT electrode is provided.

12. The acoustic wave device according to claim 2, wherein
the substrate includes:
a piezoelectric layer made of a piezoelectric material including lithium tantalate and on one main surface of which the IDT electrode is provided;
a high acoustic velocity support substrate in which an acoustic velocity of a bulk wave propagating through is higher than an acoustic velocity of an acoustic wave propagating through the piezoelectric layer; and
a low acoustic velocity film which is between the high acoustic velocity support substrate and the piezoelectric layer and in which an acoustic velocity of a bulk wave propagating through is lower than an acoustic velocity of an acoustic wave propagating through the piezoelectric layer.

13. The acoustic wave device according to claim 2, wherein a maximum thickness of the protection film is equal to or less than about half of a thickness of the IDT electrode.

14. The acoustic wave device according to claim 3, wherein the substrate includes a piezoelectric layer made of a piezoelectric material including lithium tantalate and on one main surface of which the IDT electrode is provided.

15. The acoustic wave device according to claim 3, wherein
the substrate includes:
a piezoelectric layer made of a piezoelectric material including lithium tantalate and on one main surface of which the IDT electrode is provided;
a high acoustic velocity support substrate in which an acoustic velocity of a bulk wave propagating through is higher than an acoustic velocity of an acoustic wave propagating through the piezoelectric layer; and
a low acoustic velocity film which is between the high acoustic velocity support substrate and the piezoelectric layer and in which an acoustic velocity of a bulk wave propagating through is lower than an acoustic velocity of an acoustic wave propagating through the piezoelectric layer.

16. The acoustic wave device according to claim 3, wherein a maximum thickness of the protection film is equal to or less than about half of a thickness of the IDT electrode.

17. An acoustic wave device, comprising:
a substrate;
an interdigital transducer (IDT) electrode including a plurality of electrode fingers on a main surface of the substrate; and
a protection film covering the main surface of the substrate, and side surfaces and upper surfaces of the plurality of electrode fingers; wherein
the protection film includes a portion covering the main surface of the substrate, an intermediate portion between two electrode fingers of the plurality of electrode fingers adjacent to each other, and a vicinity portion of the electrode fingers in a vicinity of the two electrode fingers, the intermediate portion being thicker than the vicinity portion; and
the protection film includes a portion covering a lower portion of the side surface of at least one of two electrode fingers and a portion covering an upper portion of the side surface of the at least one of the two electrode fingers, the portion covering the lower portion being thicker than the portion covering the upper portion.

18. An acoustic wave device, comprising:
a substrate;
an interdigital transducer (IDT) electrode including a plurality of electrode fingers on a main surface of the substrate; and
a protection film covering the main surface of the substrate, and side surfaces and upper surfaces of the plurality of electrode fingers; wherein
the protection film includes a portion covering the main surface of the substrate, an intermediate portion between two electrode fingers of the plurality of electrode fingers adjacent to each other, and a vicinity portion of the electrode fingers in a vicinity of the two electrode fingers, the intermediate portion being thicker than the vicinity portion; and
the protection film includes a portion covering a lower portion of the side surface of at least one of the two electrode fingers and a portion covering an upper portion of the side surface of the at least one of the two electrode fingers, the portion covering the lower portion being thinner than the portion covering the upper portion.

* * * * *